(12) United States Patent
Tofteberg et al.

(10) Patent No.: US 9,815,054 B2
(45) Date of Patent: Nov. 14, 2017

(54) LAB-ON-A-CHIP FABRICATION METHOD AND SYSTEM

(71) Applicant: SINTEF TTO AS, Trondheim (NO)

(72) Inventors: Terje Rosquist Tofteberg, Oslo (NO); Erik Andreassen, Oslo (NO); Michal Marek Mielnik, Jar (NO)

(73) Assignee: SINTEF TTO AS, Trondheim (NO)

( * ) Notice: Subject to any disclaimer, the term of this patent is extended or adjusted under 35 U.S.C. 154(b) by 195 days.

(21) Appl. No.: 14/888,217

(22) PCT Filed: Apr. 30, 2014

(86) PCT No.: PCT/NO2014/050069
§ 371 (c)(1),
(2) Date: Oct. 30, 2015

(87) PCT Pub. No.: WO2014/178726
PCT Pub. Date: Nov. 6, 2014

(65) Prior Publication Data
US 2016/0067708 A1    Mar. 10, 2016

(30) Foreign Application Priority Data

Apr. 30, 2013   (NO) .................................. 20130600

(51) Int. Cl.
| | |
|---|---|
| *B01L 3/00* | (2006.01) |
| *G01N 35/00* | (2006.01) |
| *H01L 21/56* | (2006.01) |
| *B29C 45/14* | (2006.01) |

(Continued)

(52) U.S. Cl.
CPC ... *B01L 3/502707* (2013.01); *B01L 3/502715* (2013.01); *B29C 45/14065* (2013.01); *B29C 45/14418* (2013.01); *H01L 21/565* (2013.01); *B01L 2200/10* (2013.01); *B01L 2200/12* (2013.01); *B01L 2300/0627* (2013.01); *B01L 2300/0816* (2013.01); *B01L 2300/16* (2013.01);

(Continued)

(58) Field of Classification Search
CPC .................................. G01N 35/00; B01L 3/00
USPC ........ 422/502, 503; 436/43, 180; 264/2.2, 5, 264/31, 165, 219, 447
See application file for complete search history.

(56) References Cited

U.S. PATENT DOCUMENTS 5,964,239 A * 10/1999 Loux ....................... B01L 9/527
                                                                    137/15.21
6,136,212 A * 10/2000 Mastrangelo ........ B01J 19/0093
                                                                    216/27

(Continued)

*Primary Examiner* — Brian J Sines
(74) *Attorney, Agent, or Firm* — Knobbe Martens Olson & Bear LLP

(57) ABSTRACT

A method for fabrication of a lab-on-a-chip system makes use of first and second mold parts, which are adapted to join each other to form a cavity to accommodate a positioning means and a support structure. The method includes receiving the chip in the positioning means, forming the cavity by joining the first and second mold parts, securing the chip with a fluid port of the chip to rest on the support structure for the support structure to mask the fluid port, introducing a molding material into the cavity to over-mold at least part of the chip and a volume extending away from the chip, separating the first and second mold parts, and extracting the chip from the mold. A fluid channel is formed by the support structure.

9 Claims, 4 Drawing Sheets

(51) Int. Cl.
B29K 101/12 (2006.01)
B29K 707/00 (2006.01)

(52) U.S. Cl.
CPC ...... *B29K 2101/12* (2013.01); *B29K 2707/00* (2013.01)

(56) References Cited

U.S. PATENT DOCUMENTS

| | | | | |
|---|---|---|---|---|
| 6,443,179 | B1* | 9/2002 | Benavides | F15C 5/00 137/454.2 |
| 6,548,895 | B1* | 4/2003 | Benavides | H01L 23/4334 137/594 |
| 2007/0072287 | A1* | 3/2007 | Morisette | B01L 3/502715 435/287.2 |
| 2009/0011549 | A1* | 1/2009 | Minotti | H01L 21/565 438/124 |
| 2009/0183555 | A1* | 7/2009 | Meng | B01L 3/502715 73/64.56 |
| 2010/0310423 | A1* | 12/2010 | Nieuwenhuis | B01L 3/5027 422/82.05 |
| 2014/0124982 | A1* | 5/2014 | Johnson | B29C 45/14065 264/275 |
| 2014/0251665 | A1* | 9/2014 | Reichwein | G01N 33/48735 174/257 |

* cited by examiner

LAB-ON-A-CHIP FABRICATION METHOD AND SYSTEM

CROSS-REFERENCE TO RELATED APPLICATIONS

This application is the U.S. National Phase under 35. U.S.C. §371 of International Application PCT/NO2014/050069, filed Apr. 30, 2014, which claims priority to Norwegian Patent Application No. 20130600, filed Apr. 30, 2013. The disclosures of the above-described applications are hereby incorporated by reference in their entirety.

INTRODUCTION

This invention relates to a heterogeneous chip system comprising a prefabricated first chip integrated into a moulded part, typically realized in a material that is different from the material of the first chip, the chip system having fluid channels or fluid conduits, and where the channels or conduits of the first chip and the moulded part are in fluidic communication with each other. A method is described for fabricating a heterogeneous chip system in a single operation.

The first chip in this invention can be made of a variety of materials. It can be a single- or a multilayer silicon chip, bonded silicon-silicon chip, silicon-glass chip, glass-glass chip, metal chip, polymer chip, etc. It can be active or passive, and it contains fluid channels. The moulded part in this invention is typically moulded in a polymer material. It can be active or passive, and it contains fluid channels.

The chip system in this invention relates to the combined system of a moulded part and one or more chips, with the chip (or chips) being embedded in the moulded part. The chip system can, in a specific embodiment, be a Lab-on-a-Chip system.

Lab-on-a-Chip systems can be realized in a variety of materials, such as polymers (hard or soft polymers, thermoplastic or thermoset polymers), paper, glass, and silicon-based materials. The material of choice depends on the application requirements; functionality, price, disposability, biocompatibility, physical properties, etc., and is often a trade-off between the advantages and disadvantages of a given material. Thermoplastic polymers are well suited for fabrication of low-cost Lab-on-a-Chip systems in large series by injection moulding, but the geometrical structure definition (e.g. aspect ratio) and the functionalities may be limited compared to, e.g., silicon-based micromachining technology. Functionalities that cannot suitably be implemented with polymers, or better implemented with other materials, include, e.g., special optical properties (silicon nitride waveguides, gold for surface plasmon resonance, glass for high optical quality), special biofunctionalities (non-specific adsorption, wettability, surface chemistry for functionalization), actuation functions (pneumatic PDMS valves, silicon micropumps, capillary pumps and valves), sensing functions (photonic biosensors, fluorescence-based assays, cantilever sensors, electrochemical sensors, nanorods and nanoparticle (magnetic and non-magnetic) based arrays, biochemical assays) and thermal control.

To create highly functional low-cost Lab-on-a-Chip systems, different materials and different manufacturing technologies should be combined.

The integration of various components in a single Lab-on-a-Chip system is presently either avoided, or implemented by connecting various microfluidic components to form a system consisting of simpler subcomponents by various assembly methods, such as adhesive bonding, welding, mechanical assembly (pressure and gasket), click-in systems, as well as various so-called plug-and-play platforms providing standardised means to assemble multicomponent systems, at the cost of increased dead-volume due to the interconnects. In addition to these interconnect technologies aimed at joining several components together in a system set-up, a variety of methods and systems for packaging and chip-to-world interfacing of microfluidic and Lab-on-a-Chip components have been developed. These typically require manual assembly, and often involve either packaging of the chip inside some carrier substrate or chip frame containing gaskets and external fluidic connectors, or clamping or adhesive bonding of fluidic connectors directly to the chip.

The object of the present invention is to provide a method for direct integration of various components/chips into a heterogeneous Lab-on-a-Chip system in a single manufacturing step while providing fluid connections between the components.

SUMMARY OF THE INVENTION

The invention provides a method for fabrication of a Lab-on-a-Chip system, the features of which method are recited in the accompanying patent claim 1.

Features of embodiments of the method of the invention are recited in the accompanying patent claims 2-4.

The invention provides a Lab-on-a-Chip system, the features of which system are recited in the accompanying patent claim 5.

Features of embodiments of the system of the invention are recited in the accompanying patent claims 6-9.

DESCRIPTION OF THE INVENTION

In the following, the invention will be described by way of example and with reference to the accompanying drawings, in which.

Figure 2:
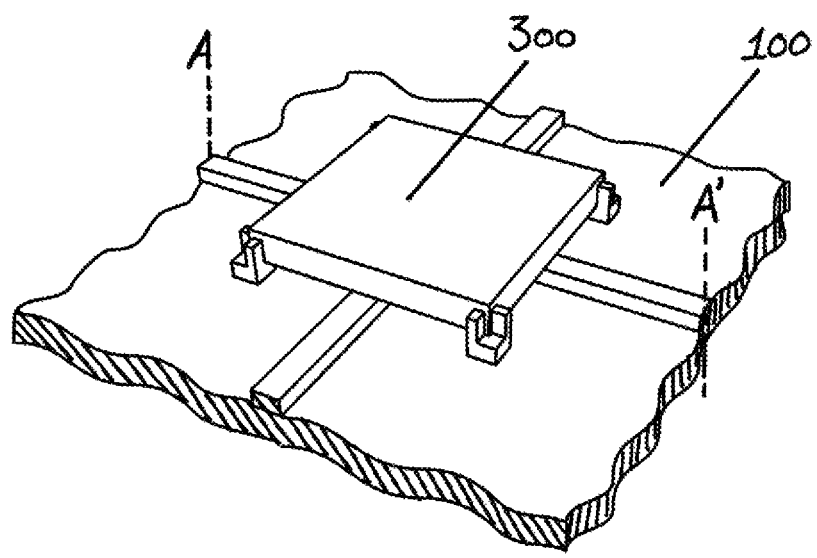
FIG. 2 is a detail perspective view drawing illustrating the first mould half 100 with an inserted first chip 300.
Figure 3:
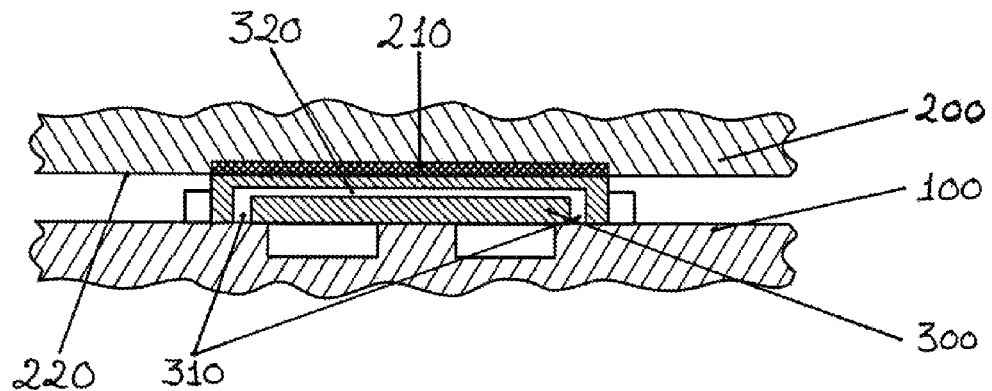
Figure 4:
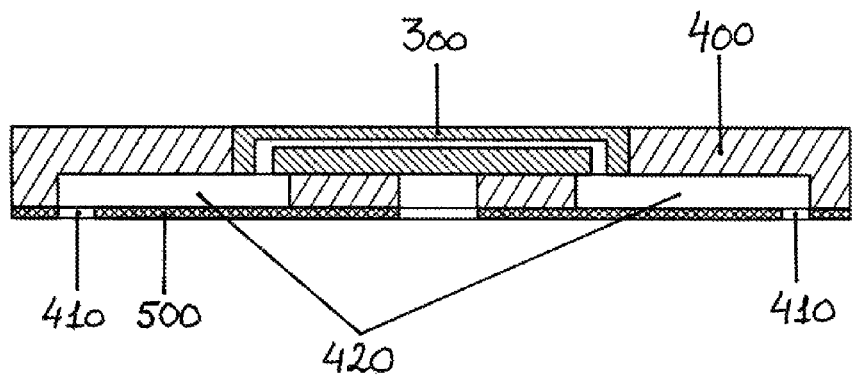
Figure 5A:
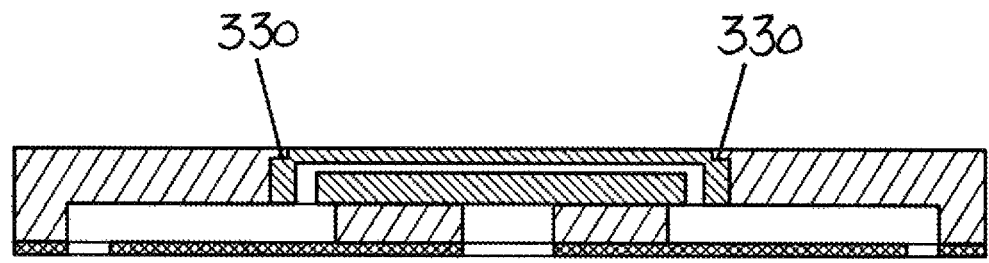
Figure 5B:
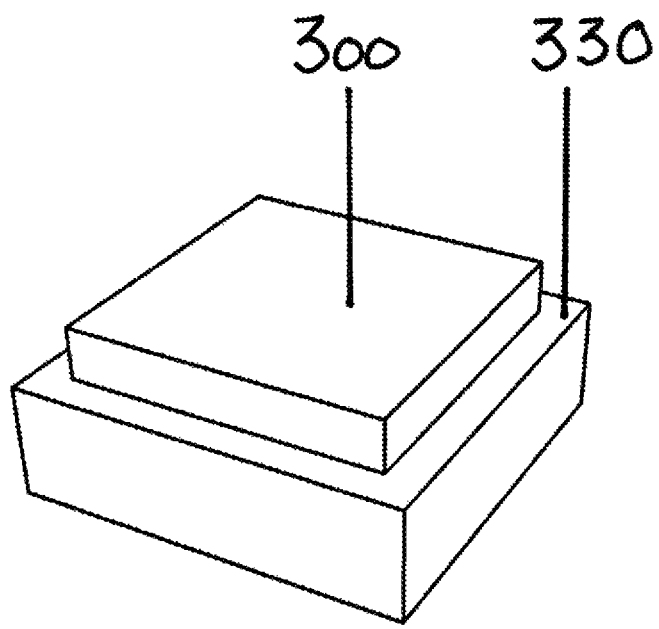
Figure 6A:
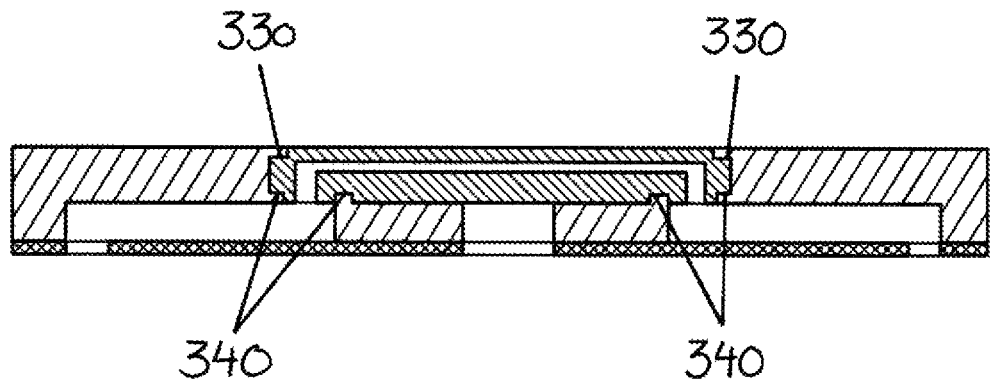
Figure 6B:
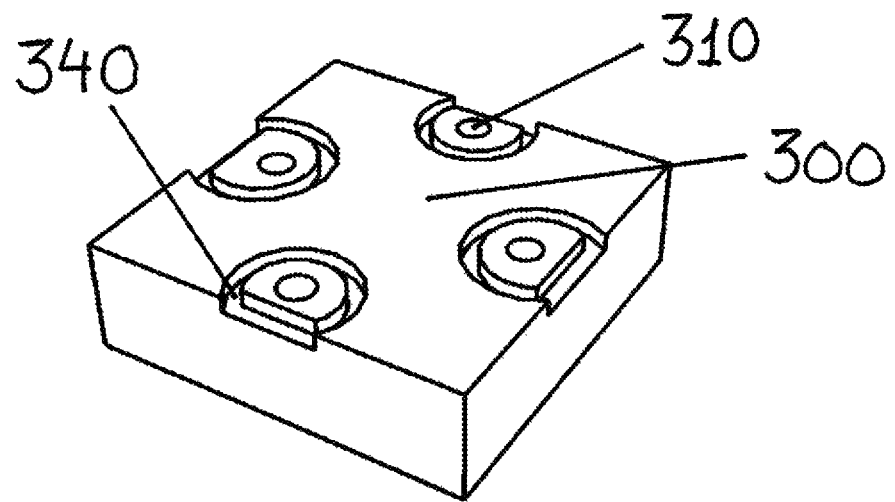

FIG. 3 is a cross section drawing of a cross section made in plane AA' of FIG. 2, of the first mould half 100 and the second mould half 200, illustrating the first chip 300 held in place by the structures in the first mould half and by the clamping force of the second mould half. In this figure the mould is closed, forming a cavity to be filled by the polymer material;

FIG. 4 is a cross section drawing of a cross section made in plane AA' of FIG. 2, of a heterogeneous chip system according to the present invention, i.e. a first chip 300 integrated in a moulded part 400, resulting from the insert moulding process with the first chip as the insert, having channels 420 formed therein by the structures 120. The chip system is laminated with a foil or plate 500, typically in a secondary process, closing the channels 420 in the chip system to form conduits, except for some fluidic ports 410 for connecting the fluid conduits in the chip system to an external device. Some other areas may also not be laminated, e.g., areas for electrical connections to the first chip, such as, e.g., a central area that has not been overmolded due to masking provided by a central support structure 130 in FIG. 1;

FIG. 5a is a cross section drawing of a chip system according to the present invention, similar to the cross section drawing of FIG. 4, but in this illustration the first chip has a ledge 330 with moulded material extending into and filling the ledge; FIG. 5b is a perspective view drawing of the first chip with a ledge 330 as shown in the illustration of FIG. 5a;

FIG. 6a is a cross section drawing of a chip system according to the present invention, similar to the cross section drawings of FIGS. 4 and 5a, corresponding to plane AA' indicated in FIG. 2, but the first chip has trenches, 340, around its fluidic ports and moulded material extending into and filling the trenches; and FIG. 6b is a perspective view drawing of the first chip with a ledge and with trenches 340 around the fluidic ports, as illustrated in FIG. 6a.

According to the invention, a pre-fabricated first chip is integrated into a moulded part in an insert moulding process. The mould is constructed so that fluidic connections are established between the first chip and the moulded part. The first chip has special design features ensuring a robust integration and leakage-free fluidic connections.

The first chip (which can be made of a variety of materials such as e.g. a single or multilayer silicon chip, bonded silicon-silicon chip, silicon-glass chip, glass-glass chip, metal chip, polymer chip) is positioned and fixed in the mould, which can be done manually, such as for small scale or prototype production, or by means of a robot or other form of feeding system. After positioning and fixing the first chip in the mould, the mould is closed, forming a cavity around the first chip, and the cavity is filled with the moulding material, e.g., a polymer melt injected in an automated injection moulding process. The first chip is partly overmoulded by the flowing moulding material, to obtain the final product of a chip system comprising a moulded part with the first chip integrated therein.

The Mould

The mould of the invention has structures and features for positioning and holding the chip in place during moulding, and structures for making the fluidic connections between the first chip and the moulded part. The mould typically has at least two parts, as shown in FIG. 3 by the two mould halves, 100 and 200, and it is typically machined in steel or other suitable metallic material, or other temperature resistant material.

Figure 1:
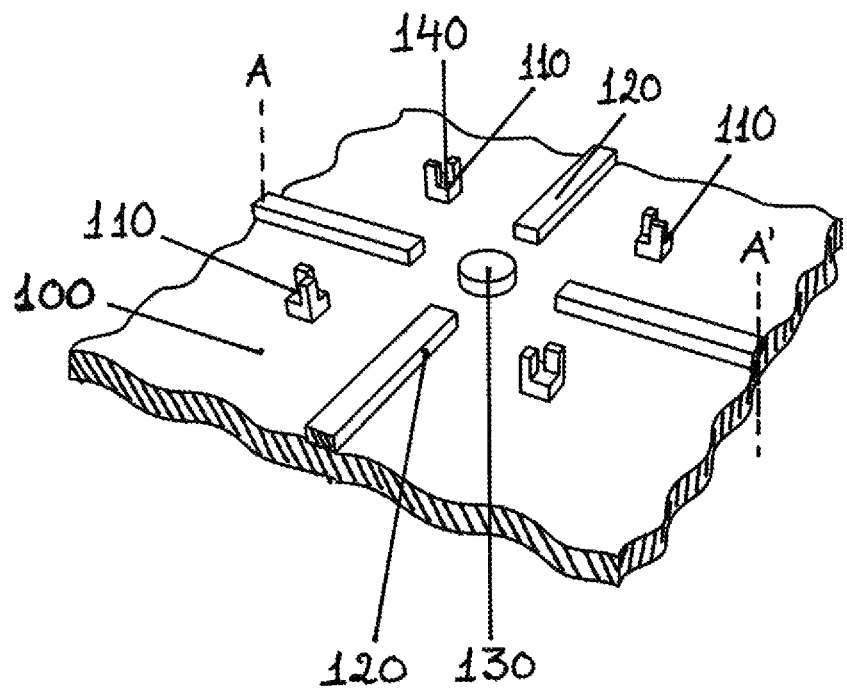
FIG. 1 is a detail perspective view drawing illustrating the first mould half 100 with structures for positioning and supporting the first chip and holding it in place, and structures for making channels in the moulded part.

The first chip can be held in place by a combination of frame structures 110 in the first mould half 100 and a clamping force provided by a clamping element of the second mould half 200 and introduced by the closing of the two mould halves, as seen in FIGS. 1-3.

Inserting the first chip may cause wear of the contacting mould surfaces of the frame structures 110. Hence, it may be necessary to coat the contacting surfaces of such frame structures with a wear resistant coating, such as, e.g., a coating of TiN. Furthermore, the outer corners of the frame structures should have a sufficiently large radius in order not to cause crack formation in the moulded part.

In addition to such frame structures for holding the first chip in the mould, vacuum could be used to hold the first chip in place prior to mould closing, e.g., via vacuum ports 140 in the frame structure 110 surface contacting the inserted chip. With a vacuum solution, the frame structures need not be very high, thus making it easier to insert the chip, and reducing the possible wear issue.

In most moulding processes/machines, the opening and closing movement of the mould is horizontal. For insert moulding, vertical moulding machines are sometimes used. A vertical machine with the first chip inserted in the bottom mould half, i.e., with the orientation as in FIG. 3, would ease the process of inserting the first chip and holding it in place in the mould (prior to mould closing).

In order to ensure a gentle, but sufficient, clamping force on the first chip during moulding, i.e., a vertical force in FIG. 3, the second mould half 200 may have an element 210 compensating for variations in the thickness of the inserted first chip 300, thereby limiting the maximum clamping-induced mechanical stress and possible damage of the first chip. The position of this compensating element 210 relative to the second mould half surface 220 could also be adjustable. The size and position of the compensating element 210 is adapted so that it presses against the first chip 300, perpendicular to its plane, with enough force to avoid moulding material flowing into the areas of the first chip that need to be exposed on the final moulded part, and avoid flow-induced movement or deformation of the first chip, while not damaging or breaking the first chip.

A simple embodiment of a compensating element 210 could be a steel mould insert coated with a polymer or rubber, e.g. Teflon or a fluorinated rubber with high temperature resistance, and good release from the moulded part during demoulding. Another embodiment of a compensating element 210 could control the clamping force on the first chip 300, and keep the clamping force constant (in all mould cycles) by adjusting the position of the compensating element along the clamping axis in each moulding cycle. The position adjustment could be implemented with a spring action or by an actuation device (electric, pneumatic, hydraulic) in combination with a force measurement.

The first mould half 100 has structures 120 which cover and protect the fluidic ports 310 on the first chip during the moulding process. Hence, these structures 120 form the fluidic interface between the first chip and the moulded part, of the chip system, and they also form channels 420 in the moulded part 400.

The first mould half 100 can have structures 130, 110 which cover and protect electrical interconnects or pads on the first chip 300.

So, to summarize, with appropriate structures 120 in the first mould half, fluidic connections between the first chip 300 and the moulded part 400 of the system are realized directly in the moulding process. Additionally, electrical connection points or other connection points on the first chip can be kept clear of moulding material during moulding by appropriately designed mould structures 110, 130.

Processes and Materials

Lab-on-a-Chip systems aimed at commercial use have typically been developed for the point-of-care market, which implies disposable, low-cost devices. The prevailing technology for fabrication of such systems is, at present, injection moulding, using thermoplastic polymer materials, typically transparent amorphous polymer such as PMMA, COC, COP, PC or PS. Injection moulding of thermoplastic materials offers low cost per unit.

The present invention for fabricating heterogeneous lab-on-a-chip systems is well suited for injection moulding with thermoplastic polymer materials.

However, the invention is not restricted to injection moulding of thermoplastic materials, including special injection moulding process such as injection-compression moulding. The invention is also suitable for moulding of other materials, such as thermoset polymers (e.g. silicone rubber or polyurethane), metal powders, and ceramic powders. Furthermore, the invention is also suitable for other fabrication processes (with various materials) involving flowing materials, such as compression moulding, transfer moulding, vacuum casting, hot embossing, thermoforming, micro/nano imprinting, various processes involving UV curing, as well as extrusion processes and coating.

The invention is basically independent of the choice of moulding material, and the moulding material is primarily selected based on the specifications of the given Lab-on-a-Chip system. However, secondarily, for a given first chip (material and geometry), some moulding materials (type and grade) may have certain advantages in terms of obtaining reliable and leakage-free fluidic connections between first chip and moulded part.

In terms of achieving good adhesion between chip and moulded part, the moulding material could be selected among available materials with proven adhesion performance for the given chip material. This could, e.g., be a polymer moulding material forming hydrogen bonds, or even covalent chemical bonds, with the surface of the chip.

In order to reduce thermal and flow-induced stresses in the moulded part 400, optimization of the moulding conditions may be required. Pre-heating of the inserted first chip 300 may be beneficial. Active or passive local heating of the mould wall in the area of the rather thin section to be filled under the inserted first chip 300 may ease the filling of this section, reduce the severity of weld lines, and reduce stresses in the moulded part. A simple implementation of this could be passive local heating by using a temperature resistant polymer material in the mould wall, thereby locally reducing the solidification rate of flowing moulding material.

When considering injection moulding of amorphous transparent thermoplastic polymer materials, the performance of the Lab-on-a-Chip system of this invention may be optimized by selecting a material with the most suitable viscosity (molecular weight distribution). Typically three materials in the same polymer family, but with different viscosities, could be used in optimization moulding trials. A material with low viscosity is advantageous in terms of filling the typically thin sections between the inserted chip and the mould wall. On the other hand, the viscosity (and, hence, the molecular weight) should be above a certain level for the material to have sufficient resistance to crack formation (crack formation due to geometry/notch effects and due to process-induced residual stresses). It is also known that some of the amorphous transparent polymer materials, such as polycarbonate, are more resistant to crack formation than others. Finally, amorphous polymers have relatively small shrinkage upon solidification, which is an advantage for this insert moulding process.

Features of the First (Inserted) Chip

In order to provide leakage-free fluidic connections between the first chip 300 and the moulded part 400, and avoid long-term failures (e.g. delamination between the first chip and the moulded part), there must be adequate adhesion between the first chip and the moulded part. This can be ensured by chemical means and/or by mechanical means.

If the first chip is made of silicon, vacuum dehydration of the silicon chip may be sufficient to provide adequate adhesion. In other cases the first chip may need surface treatment prior to moulding, or coupling agents can be added to the polymer. (Note that many polymers for injection moulding have additives for easy release from moulds. This may impede the adhesion between the polymer and first chip.) A common way to improve the adhesion between an inorganic material (the typical material in the first chip) and an organic polymer is to perform a silane surface treatment of the inorganic surface, with a silane molecule that gives a good bond (not necessarily covalent bonds) to the chosen polymer or class of polymers. The silane treatment can be performed by wet chemistry or, more cost-effective, in a plasma-induced process. In-mould plasma treatment (also roughening the surface) or just plasma cleaning are also alternatives.

However, chemical surface treatments add complexity and cost to the process. There are other ways to avoid leakage in the interface between the first chip and the moulded part.

Trenches/grooves 340 can be machined around the fluidic ports 310 on the first chip 300, as illustrated in FIGS. 6a and 6b. These trenches/grooves can function as mechanical gaskets; the moulding material is forced into the trenches during moulding, creating a liquid-proof seal around the fluidic ports 310. There can be one or several trenches around a port. If the first chip is made of silicon, trenches with a negative draft angle can be made, with appropriate silicon micromachining processes, thereby making a strong mechanical anchoring of the polymer onto the silicon chip (trenches). Even simpler, introduction of roughness or random geometrical structures on the surface area fluidic inlets of the first chip may also facilitate leakage-free connections.

Trenches and other geometrical structures can be implemented as an integrated part of the first chip manufacturing process, or as a final step of the first chip manufacturing process. The structures can be realized by a variety of micromachining methods such as wet or dry etching, dicing, laser ablation, etc.

In order to ensure a robust mechanical integration, and to prevent the inserted first chip 300 to be pushed from the support 110, 120, 130 due to the shrinkage of the moulding material upon solidification, additional holding structures can be introduced for the first chip. These structures can be realized as grooves into the first chip, or as ledges 330 around the top surface of the first chip, as illustrated in FIGS. 5a, 5b, 6a and 6b. If the first chip is a silicon chip or a silicon-glass chip, such a ledge can be realized by a two-step wafer dicing process.

When the moulding process is finalized, the first chip is integrated in the moulded part. In the realization shown in FIGS. 3-5, the first chip 300 can have channels micromachined in silicon, and a transparent glass lid towards the compensating element 210 in the second mould half 200. Hence the glass lid will be flush with the surface of the moulded part 400 after moulding. In this way, excellent optical access to the channels inside the first chip is ensured. Such access is important in applications where imaging or optical readout of the chip functions are necessary. In cases where optical access is not essential, the top surface of the first chip 300 can be immersed in the bulk of the moulded part 400.

The first chip 300 can contain a variety of passive structures or active structures or a combination of both. Specifically it can contain channels, chambers, filters, metering structures, mixing structures, particle traps, arrays of rods, three-dimensional structures. The first chip can have active elements, such as a pump, a valve, a heating element, a pressure sensor, a temperature sensor, an accelerometer, a mass flow meter, or any type of micro-electro-mechanical, micro-opto-electro-mechanical, bio-micro-electro-mechanical, or other type of sensor or actuator. It can be a chemical sensor, a biosensor, in particular an optical, mechanical, electrochemical, acoustic, or photonic biosensor, and energy harvesting device, or a bioreactor or chemical reactor. The first chip can contain nanostructures and nanoparticles, as well as pre-stored chemicals. The first chip can also contain biofunctionalized and bioactive areas, and chemically modified areas, such as anchor points for subsequent biofunctionalization.

Secondary Processes

Secondary processing steps that are established for moulded Lab-on-a-Chip systems, such as chemical surface treatment of the moulded channels, can also be implemented for the moulded parts made with this invention.

The final fabrication step is typically to seal off the (open) moulded channels 420. The conventional way to do this is to apply a foil or plate 500 by, e.g., adhesive bonding or welding.

DESCRIPTION OF REFERENCE NUMERALS

100: First mould half
110: Frame structures for holding the inserted first chip in place
120: Structures forming channels in the moulded part and fluidic connections between the chip and the moulded part
130: Structure which forms an exposed area to the first chip, e.g., for electrical connections to the first chip, and also supports the first chip mechanically in the process
140: Possible positions for vacuum ports
200: Second mould half
210: Compensating element
220: Mould surface of the second mould half
300: The prefabricated inserted first chip
310: Fluidic ports on the first chip
320: Channel through the first chip
330: Ledge on the first chip
340: Trenches around the fluidic ports 310 on the first chip 300
400: Moulded part
410: Fluidic ports in the moulded part
420: Channels in the moulded part
500: Lamination foil or plate

What is claimed is:

1. A method for fabrication of a Lab-on-a-Chip system, the method comprising:
    providing a mould comprising first and second mould parts, at least one of the first and second mould parts having a positioning means adapted to receive and position a chip to rest on a first support structure, and the first and second mould parts adapted to join each other to form a cavity to accommodate therein the positioning means and the first support structure,
    receiving the chip in the positioning means,
    forming said cavity by joining the first and second mould parts,
    securing the chip with a fluid port of the chip to rest on the first support structure for the first support structure to mask the fluid port,
    introducing a moulding material into said cavity to overmould at least part of the chip and a volume of the cavity extending away from the chip,
    separating the first and second mould parts,
    extracting from the mould the chip overmoulded by said moulding material in areas being adjacent to an area of the fluid port masked by the first support structure and extending away from the chip with, in a first surface, a fluid channel formed by the first support structure.

2. The method of claim 1, further comprising applying a cover to the first surface to cover at least part of said fluid channel so as to form a fluid conduit in communication with the fluid port of the chip.

3. The method of claim 1, further comprising providing in at least one of the first and second mould parts a securing means for securing the chip in said positioning means.

4. The method of claim 1, wherein the chip is a silicon chip.

5. A lab-on-a-chip system comprising a chip having a fluid port and being overmoulded by a moulding material in at least an area surrounding the fluid port, and having moulding material extending away from the chip, said moulding material extending away from the chip having in a first surface overlying at least part of the chip a fluid channel in communication with the fluid port of the chip.

6. The lab-on-a-chip system of claim 5, wherein the system further comprises a cover applied to the first surface to cover at least part of said fluid channel so as to form a fluid conduit, and the cover extending over a part of said first surface surrounding the fluid port for the fluid conduit to be in communication with the fluid port.

7. The lab-on-a-chip system of claim 5, wherein the chip has a ledge along a side thereof, and the ledge being overmoulded by said moulding material for securing the chip.

8. The lab-on-a-chip system of claim 5, wherein an area of the chip surrounding the fluid port comprises one or more trenches, a roughened surface, or a treated surface, for enhancing adherence of moulding material on that area to the chip.

9. The lab-on-a-chip system of claim 5, wherein the chip is a silicon chip.

* * * * *